US008536905B2

(12) United States Patent
Uchino et al.

(10) Patent No.: US 8,536,905 B2
(45) Date of Patent: Sep. 17, 2013

(54) LEVEL SHIFT CIRCUIT

(75) Inventors: Tatsuya Uchino, Kanagawa (JP); Hiromi Saitou, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/444,198

(22) Filed: Apr. 11, 2012

(65) Prior Publication Data
US 2012/0223760 A1 Sep. 6, 2012

Related U.S. Application Data

(62) Division of application No. 12/801,246, filed on May 28, 2010, now Pat. No. 8,264,269.

(30) Foreign Application Priority Data

Jun. 22, 2009 (JP) .................................. 2009-148047

(51) Int. Cl.
*H03K 3/00* (2006.01)
(52) U.S. Cl.
USPC ......................................................... 327/108
(58) Field of Classification Search
None
See application file for complete search history.

(56) References Cited

U.S. PATENT DOCUMENTS

| 6,515,512 | B2* | 2/2003 | Chen ................................ 326/62 |
| 7,554,384 | B2* | 6/2009 | Dibene et al. .................. 327/535 |
| 7,598,780 | B2* | 10/2009 | Kibune .......................... 327/108 |
| 7,649,381 | B2 | 1/2010 | Yamashita et al. |
| 2007/0115041 | A1 | 5/2007 | Tachibana et al. |
| 2008/0157816 | A1 | 7/2008 | Yamashita et al. |
| 2009/0237124 | A1* | 9/2009 | Nakajima ..................... 327/108 |
| 2010/0026343 | A1 | 2/2010 | Yang et al. |

FOREIGN PATENT DOCUMENTS

| JP | 2006-352502 | 12/2006 |
| JP | 2008-167094 A | 7/2008 |

OTHER PUBLICATIONS

Notice of Grounds for Rejection with English translation dated Apr. 23, 2013 with partial English Translation.

* cited by examiner

*Primary Examiner* — Lincoln Donovan
*Assistant Examiner* — Khareem E Almo
(74) *Attorney, Agent, or Firm* — McGinn IP Law Group, PLLC

(57) ABSTRACT

A level shift circuit including a level shift voltage generation circuit that receives an input signal having an amplitude between a voltage of a first voltage system power supply and a ground potential and performs conversion of the amplitude of the input signal to produce an output signal voltage with an amplitude between a voltage of a second voltage system power supply and the ground potential, a replica circuit monitoring a voltage corresponding to a logic threshold of the first voltage system power supply, the replica circuit, with the logic threshold of the first voltage system power supply as an input, monitoring and outputting a voltage corresponding to a logic threshold of the second voltage system power supply, and a bias generation circuit that receives an output from the replica circuit and generates a bias.

18 Claims, 7 Drawing Sheets

FIG. 6A PRIOR ART IN
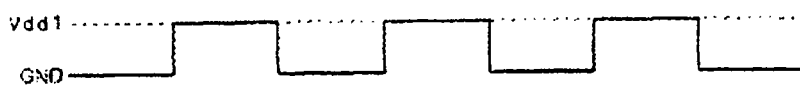
FIG. 6B PRIOR ART NOT1
FIG. 6C PRIOR ART Q1
FIG. 6D PRIOR ART C1 (Q2 GATE)
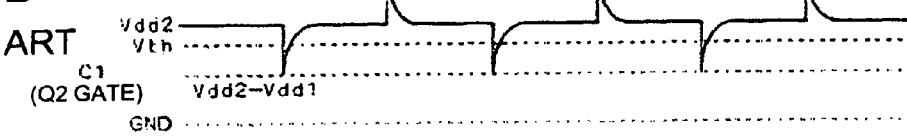
FIG. 6E PRIOR ART Q2
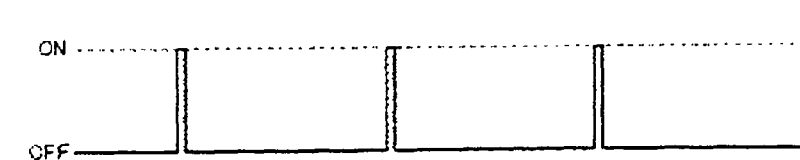
FIG. 6F PRIOR ART OUT
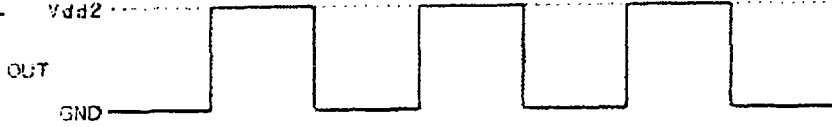

LEVEL SHIFT CIRCUIT

REFERENCE TO RELATED APPLICATION

The present application is a Divisional Application of U.S. patent application Ser. No. 12/801,246, which was filed on May 28, 2010 now U.S. Pat. No. 8,264,269.

This application is based upon and claims the benefit of the priority of Japanese patent application No. 2009-148047, filed on Jun. 22, 2009, the disclosure of which is incorporated herein in its entirety by reference thereto.

TECHNICAL FIELD

The present invention relates to a level shift circuit. More specifically, the invention relates to a circuit configuration that is suitable for level shifting of a high-frequency input.

BACKGROUND

In semiconductor integrated circuits, with the improvement of fine fabrication process, reduction of an operating voltage has been made. However, LSIs including a plurality of power supply voltages have been increased so as to enable a circuit which cannot be operated at a low-voltage to operate. The frequency of a circuit operation (such as 500 MHz or higher) has been made higher in order to realize wireless high-speed communication.

It is necessary for a level shift circuit of a semiconductor integrated circuit to pass a high-frequency signal from a low-voltage power supply to a high-voltage power supply while maintaining the duty ratio of an input signal. Generally, the variation in the duty ratio of an output signal with respect to the input signal in the level shift circuit is caused by a difference in an inclination (slew rate) in a rise/fall of each of the input and output signals. When the signal has a high frequency (500 MHz or more), the duty ratio is significantly affected even by a slight variation of inclination in the rise/fall of the signal. Accordingly, the development of a level shift circuit that is able to maintain duty ratio at a high frequency (500 MHz or more) has been desired.

FIG. 5 (which is FIG. 1 in Patent Document 1) is a diagram showing a configuration of a level shift circuit disclosed in Patent Document 1. As shown in FIG. 5, a level shift circuit 100 receives at an input terminal IP thereof an output of an inverter NOT1 corresponding to a voltage amplitude between a first power supply voltage Vdd1 and a ground voltage GND and converts the level of the received signal to a signal of a voltage amplitude between a second power supply voltage Vdd2 and the ground voltage GND. A resistor element R1 for pull-up is connected between a second power supply terminal T2 and an output terminal OUT, and an N-channel MOS transistor Q1 is connected between the output terminal OUT and a ground terminal TG. A P-channel MOS transistor Q2 is connected in parallel with the resistor element R1 between the second power supply terminal T2 and the output terminal OUT. A gate electrode of the N-channel MOS transistor Q1 is connected to the input terminal IP. There are also provided a resistor element R2 and a capacitor C1 connected in series from the second power supply terminal T2 in the stated order. A gate electrode of the P-channel MOS transistor Q2 is connected to a connection node of the resistor element R2 and the capacitor C1. An input terminal of an inverter NOT1 is connected to an input terminal IN, and the inverter NOT1 inverts an input signal (a signal equivalent to the voltage amplitude between the first power supply voltage Vdd1 and the ground voltage GND) supplied from the input terminal IN to output the inverted signal.

FIGS. 6A to 6F are timing charts showing an operation of the circuit in FIG. 5 (based on FIG. 2 in Patent Document 1). An operation of the level shift circuit 100 will be described with reference to FIGS. 5 and 6.

FIG. 6A is a timing chart of an input signal IN to the inverter NOT1 in FIG. 5;

FIG. 6B is a timing chart of an output signal of the inverter NOT1 in FIG. 5;

FIG. 6C is a timing chart of turning on (ON)/off (OFF) of the N-channel MOS transistor Q1 in FIG. 5;

FIG. 6D is a timing chart of a voltage at the gate electrode (terminal voltage of the capacitor C1) of the P-channel MOS transistor Q2 in FIG. 5;

FIG. 6E is a timing chart of turning on (ON)/off (OFF) of the P-channel MOS transistor Q2 in FIG. 5; and FIG. 6F is a timing chart of an output signal of the level shift circuit 100 in FIG. 5. FIG. 6D shows a threshold voltage Vth of the P-channel MOS transistor Q2 as well.

<Rise Operation of Output Signal>

A rise operation of the output signal of the level shift circuit 100 will be described. Assume that the input signal to the inverter NOT1 changes from Low to High (from the ground voltage GND to the first power supply voltage Vdd1) (as shown in FIG. 6A), and then the output signal of the inverter NOT1 changes from High to Low (from the first power supply voltage Vdd1 to the ground voltage GND) (as shown in FIG. 6B). At this timing of the change, the N-channel MOS transistor Q1 changes from ON to OFF (as shown in FIG. 6C). In this case, electric charges are charged at the capacitor C1, and a potential difference of (Vdd2−Vdd1) is produced between two electrodes of the capacitor C1. For this reason, at a moment when a voltage at a low-potential side electrode (electrode on the side connected to the output of the inverter NOT1) of the capacitor C1 varies from the first power supply voltage Vdd1 to the ground voltage GND, the gate voltage of the P-channel MOS transistor Q2, or a voltage at a high-potential side electrode (electrode connected to the resistor element R2) of the capacitor C1 varies from the second power supply voltage Vdd2 to (Vdd2−Vdd1) (as shown in FIG. 6D). With this variation, when the voltage at the high-potential side electrode (electrode connected to the resistor element R2) of the capacitor C1 reaches (falls to) the threshold voltage Vth, the P-channel MOS transistor Q2 changes from OFF to ON (as shown in FIG. 6E). A voltage at the output terminal OUT of the level shift circuit 100 instantaneously changes from Low to High (from the ground voltage GND to the second power supply voltage Vdd2).

Then, according to a time constant defined by a resistance value of the resistor element R2 and a capacitance of the capacitor C1, electric charges are charged into the capacitor C1 from the second power supply terminal T2 through the resistor element R2 with an elapse of time. Then, when the voltage at the high-potential side electrode of the capacitor C1 (electrode on the side connected to the resistor element R2) becomes higher than the threshold voltage Vth (as shown in FIG. 6D), the P-channel MOS transistor Q2 turns OFF (as shown in FIG. 6E). When the P-channel MOS transistor Q2 turns on, the gate voltage of the P-channel MOS transistor Q2 or the voltage at the high-potential side electrode of the capacitor C1 instantaneously falls to (Vdd2−Vdd1). It is because the inverter NOT1 is configured so that an output impedance of the inverter NOT1 becomes negligibly smaller than an impedance of the resistor element R1. A discharge time constant of the capacitor C1 is negligibly reduced, so that the capacitor C1 instantaneously discharges.

<Fall Operation of Output Signal>

Next, a fall operation of the output signal of the level shift circuit 100 will be described. Assume that the input signal to the inverter NOT1 changes from High to Low (from the first power supply voltage Vdd1 to the ground voltage GND) (as shown in FIG. 6A), and then the output signal of the inverter NOT1 changes from Low to High (from the ground voltage GND to the first power supply voltage Vdd1) (as shown in FIG. 6B). At this timing of the change, the N-channel MOS transistor Q1 changes from OFF to ON (as shown in FIG. 6C). In this case, electric charges are charged at the capacitor C1, and a potential difference of (Vdd2-GND) is produced between the two electrodes of the capacitor C1. When the voltage at the low-potential side electrode (electrode on the side connected to the output of the inverter NOT1) varies from the ground voltage GND to the first power supply voltage Vdd1, the gate voltage of the P-channel MOS transistor Q2, or the voltage at the high-potential side electrode (electrode connected to the resistor element R2) of the capacitor C1 instantaneously increases from the second power supply voltage Vdd2 to (Vdd2+Vdd1) (as shown in FIG. 6D).

Even if the gate voltage of the P-channel MOS transistor Q2 increases, the P-channel MOS transistor Q2 does not turn on (as shown in FIG. 6E). According to the time constant defined by the resistance value of the resistor element R1 and the capacitance of the capacitor C1, the voltage at the high-potential side electrode of the capacitor C1 falls with an elapse of time, and is stabilized at the second power supply voltage Vdd2. Further, the N-channel MOS transistor Q1 turns on. The voltage at the output terminal OUT changes from High to Low (from the second power supply voltage Vdd2 to the ground voltage GND).

[Patent Document 1]
JP Patent Kokai Publication No. JP2006-352502A (FIGS. 1 and 2)

SUMMARY

The disclosure of the above Patent Document is incorporated herein by reference thereto. Now, the following analyses are given by the present invention.

An analysis of the related art by the present invention will be given below.

The level shift circuit described with reference to FIGS. 5 and 6 has a problem that the duty ratio of the input/output signal varies at a high-frequency operation, due to variations in a transistor characteristic such as a threshold value Vth of transistors. The variations in transistor characteristic may result mainly from fabrication variations.

Input and output characteristics shown in FIGS. 7A and 7B will be described below. FIGS. 7A and 7B have been prepared for this application by the inventor of the present invention in order to describe the above-mentioned problem.

FIG. 7A is a characteristic diagram of an output OUT with respect to a rise of the input signal IN. FIG. 7B is a characteristic diagram of the output OUT with respect to a fall of the input signal IN.

The following relationship holds in order to perform a level shift operation where the duty ratio of the input signal is maintained: when the rising input signal IN crosses an input voltage Vr2 at an intersection J, the output signal OUT crosses an output voltage Vr3a at an intersection M, at a time t1 in FIG. 7A. The input voltage Vr2 is a logic threshold of a low-voltage system, while the output voltage Vr3a is a logic threshold of a high-voltage system.

When the falling input signal IN crosses the input voltage Vr2 that is the logic threshold of the low-voltage system at an intersection L, the output signal OUT crosses the output voltage Vr3a that is the logic threshold of the high-voltage system at an intersection K, at a time t2 in FIG. 7B.

However, assume that the logic threshold Vr3a of the high-voltage system varies to a logic threshold Vr3c of the high-voltage system due to the fabrication variations (variations in the transistor threshold values Vth), for example. Then, with respect to intersections between the input and output signals and the logic thresholds, only the intersection where the output signal crosses varies. The intersection where the output OUT for the rising input signal IN crosses the logic threshold Vr3c changes from the intersection M at the time t1 to an intersection I at a time t3. The intersection where the output OUT for the falling input signal IN crosses the logic threshold Vr3c changes from the intersection K at the time t2 to an intersection N at a time t4.

That is, the time when the input signal crosses the logic threshold of the low-voltage system does not match the time when the output signal crosses the logic threshold of the high-voltage system. Thus, the duty ratio of the output signal OUT cannot be maintained.

Further, in the level shift circuit 100 in FIG. 5, the circuit that causes the output signal OUT to rise is different from the circuit that causes the output signal OUT to fall. Thus, it is difficult to obtain a same inclination of the output signal OUT between a rise and a fall of the output signal OUT.

Assume that the N-channel MOS transistor Q1 and the P-channel MOS transistor Q2 in FIG. 5 are adjusted so that inclinations of the rise and fall of the output signal OUT are the same, and then the intersection I between the output signal and the output logic threshold in FIG. 7A is changed to the intersection M at the time t1 and the intersection N between the output signal and the logic threshold in FIG. 7B is changed to the intersection K at the time t2, based on the input and output characteristics shown in FIGS. 7A and 7B.

Even with this arrangement, however, the inclination of the rise of the output signal OUT is affected by manufacturing variation of the P-channel MOS transistor Q2 (variation in the threshold value Vth of the transistor), and the inclination of the fall of the output signal OUT is affected by manufacturing variation of the N-channel MOS transistor Q1 (variation in the threshold value Vth of the transistor). That is, the circuit configuration that causes the output signal OUT to rise is different from the circuit configuration that causes the output signal OUT to fall. Accordingly, it is actually impossible to match change amounts caused by the fabrication variations (variations in the transistor threshold values Vth) added to characteristic values of the N-channel MOS transistor Q1 and the P-channel MOS transistor Q2 that determine the inclinations of the rise and fall of the output signal OUT. That is, due to the fabrication variations (variations in the transistor threshold values Vth), the duty ratio of the output signal OUT cannot be maintained. For this reason, a level shift operation cannot be performed where the duty ratio of the input signal is maintained.

The present invention, which has been made to solve one or more of the above-mentioned problems, may be summarized as follows, though not limited thereto.

According to the present invention, there is provided a level shift circuit comprising:

a level shift voltage generation circuit that receives an input signal having an amplitude between a voltage of a first voltage system power supply and a ground potential and performs conversion of the amplitude of the input signal to produce an output signal voltage with an amplitude between a voltage of a second voltage system power supply and the ground potential, the voltage of the second voltage system power supply being higher than the voltage of the first voltage system power supply;

a replica circuit that includes an element having the same configuration as an element of the level shift voltage generation circuit, the replica circuit monitoring a voltage corresponding to a logic threshold of the first voltage system, the replica circuit, with the logic threshold of the first voltage system as an input, monitoring and outputting a voltage corresponding to a logic threshold of the second voltage system; and a bias generation circuit that receives an output from the replica circuit and generates a bias for adjusting a variation of the output voltage of the level shift voltage generation circuit and a variation of the output voltage of the replica circuit to supply the bias to the level shift voltage generation circuit and the replica circuit. The level shift voltage generation circuit generates the output signal voltage in such a manner that in synchronization with a time when the input signal voltage received by the level shift voltage generation circuit crosses the logic threshold of the first voltage system, the output signal voltage crosses the logic threshold of the second voltage system.

In the present invention, the replica circuit comprises:

a first logic circuit that has a signal amplitude between the voltage of the first voltage system power supply and the ground potential and has the same configuration as a corresponding circuit included in the level shift voltage generation circuit; and a second logic circuit that has a signal amplitude between the voltage of the second voltage system power supply and the ground potential and has the same configuration as a corresponding circuit included in the level shift voltage generation circuit, wherein the replica circuit has an arrangement in which the first logic circuit has an output fully feedback-connected to an input to detect the voltage corresponding to the logic threshold of the first voltage system and the second logic circuit has an output thereof fully feedback-connected to an input to detect the voltage corresponding to the logic threshold of the second voltage system.

In the present invention, the bias generation circuit comprises a comparator circuit that compares an output of the second voltage system of the replica circuit with the threshold voltage of the second voltage system outputted from the replica circuit and the bias generation circuit generating a voltage that adjusts the level shift voltage generation circuit and the replica circuit, based on a result of the comparison by the comparator circuit.

According to the present invention, a level shift operation, where the duty ratio of an input signal is maintained, can be performed.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 6A to 6F are timing charts explaining an operation of the level shifter in FIG. 5.

PREFERRED MODES

Preferred modes of the present invention will be described below. A level shift circuit according to the present invention, which level-shifts an input signal from a low voltage to a high voltage, includes a level shift voltage generation circuit (201), a replica circuit (202), and a bias generation circuit (203). The level shift voltage generation circuit (201) receives the input signal generated by a voltage of a low-voltage system power supply (Vdd1: first voltage system power supply) and a ground potential, converts an amplitude of the received input signal from the voltage of the low-voltage system power supply to a voltage between a voltage of a high-voltage system power supply (Vdd2: second voltage system power supply) and the ground potential, and outputs the voltage. The replica circuit (202) has a same element configuration as the level shift voltage generation circuit (201). The replica circuit (202) monitors a threshold voltage of an input signal voltage, and generates an output voltage that is made to track a logic threshold of the high-voltage system power supply. The bias generation circuit (203) is provided to adjust variations of the output voltages of the level shift voltage generation circuit (201) and the replica circuit (202). In synchronization with crossing of an input signal voltage Vin through a logic threshold voltage of a low-voltage system inverter (INV1) in the level shift voltage generation circuit (201), an output (LSout) of a push-pull circuit (formed of transistors MP1, MN2) in the level shift voltage generation circuit (201) operates to cross a logic threshold of an output inverter (INV3), irrespective of an inclination of a rise/fall waveform of the input signal. With this arrangement, the duty ratio of the output (LSout) of the push-pull circuit (MP1, MN2) in the level shift voltage generation circuit (201) at the logic threshold voltage of the high-voltage system inverter (INV3) does not vary from the duty ratio of the input signal voltage (Vin) at the logic threshold voltage of the low-voltage system inverter (INV1), and becomes equal. A description will be given below in connection with exemplary embodiments.

Figure 1:
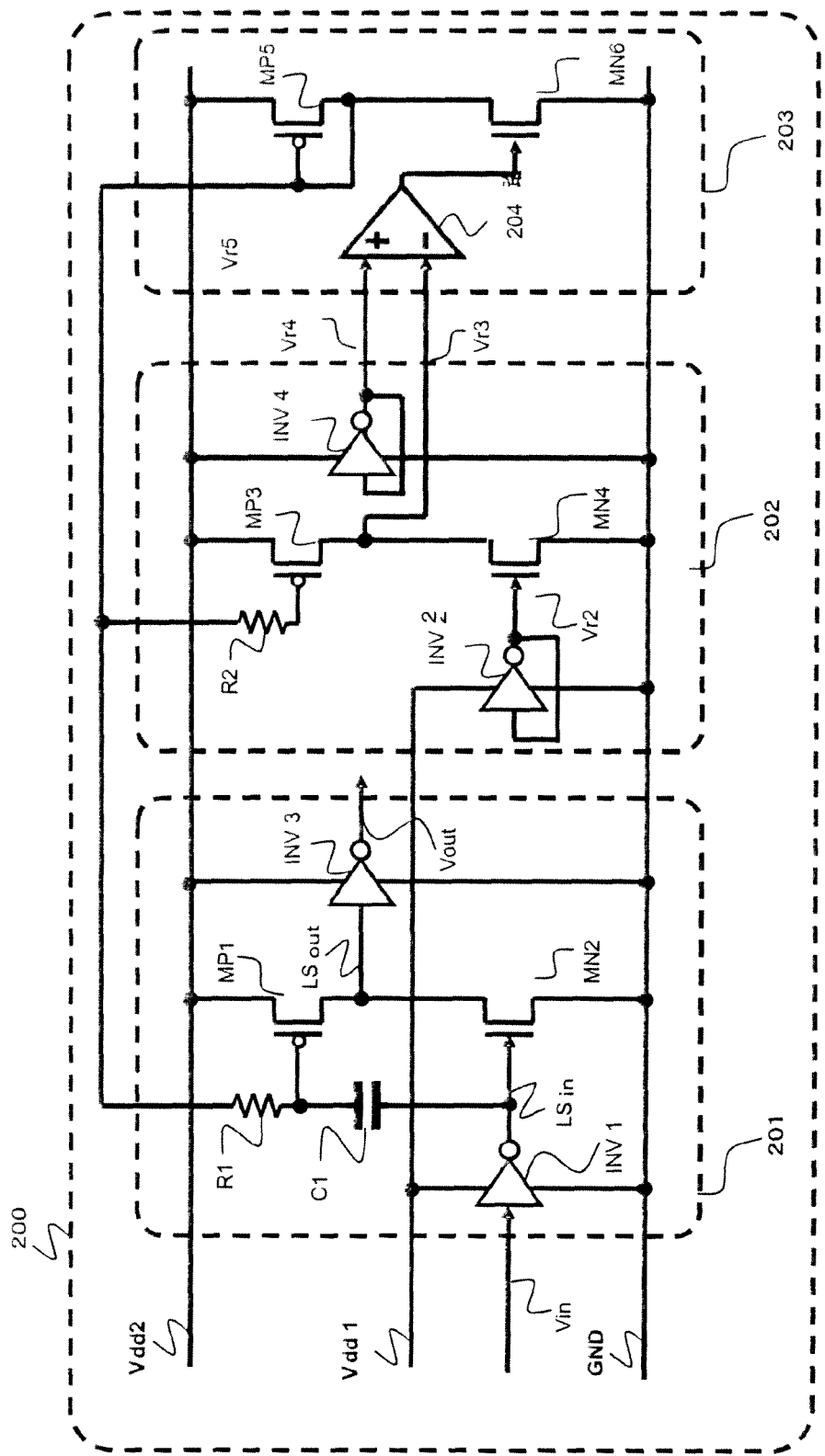
FIG. 1 is a diagram showing a configuration of a level shift circuit in an exemplary embodiment of the present invention.

FIG. 1 is a diagram showing a circuit configuration of an exemplary embodiment of the present invention. A level shift circuit 200 shown in FIG. 1 includes a level shift voltage generation circuit 201, a DC bias replica circuit 202, and a bias generation circuit 203.

The level shift voltage generation circuit 201 includes:

an inverter (low-voltage system inverter) INV1 that is connected between a low-voltage system power supply Vdd1 and the GND and receives an input signal Vin;

a resistor element R1 and a capacitance element C1 connected in series between an output Vr5 of the bias generation circuit 203 and an output LSin of the low-voltage system inverter INV1;

a P-channel MOS transistor MP1 which has a source connected to a high-voltage system power supply Vdd2 and a gate connected to a connection node of the resistor element R1 and the capacitance element C1;

an N-channel MOS transistor MN2 which has a drain connected to a drain of the P-channel MOS transistor MP1, a gate connected to the output LSin of the inverter INV1, and a source connected to the GND; and an inverter (high-voltage system inverter) INV3 connected between the high-voltage system power supply Vdd2 and the GND, with an input connected to a connecting node LSout between the drain of the P-channel MOS transistor MP1 and the drain of the N-channel MOS transistor MN2. An output Vout of the high-voltage system inverter INV3 is set to an output of the level shift circuit 200. The P-channel MOS transistor MP1 and the N-channel MOS transistor MN2 form a push-pull circuit.

The DC bias replica circuit 202 includes:

an inverter (low-voltage system inverter) INV2 connected between the low-voltage system power supply Vdd1 and the GND, with an output thereof feedback connected to an input thereof;

a P-channel MOS transistor MP3 which has a source connected to the high-voltage system power supply Vdd2 and a gate connected to an output Vr5 of the bias generation circuit 203 through a resistor element R2;

an N-channel MOS transistor MN4 which has a drain connected to a drain of the P-channel MOS transistor MP3, a gate connected to an output Vr2 of the low-voltage system inverter INV2, and a source connected to the GND; and an inverter (high-voltage system inverter) INV4 connected between the high-voltage system power supply Vdd2 and the GND, with an output thereof feedback connected to an input thereof. The P-channel MOS transistor MP3 and the N-channel MOS transistor MN4 form a push-pull circuit.

The bias generation circuit 203 includes:

a differential amplifier circuit (comparator circuit) 204 with a non-inverting input terminal (+) connected to an output Vr4 of the high-voltage system inverter INV4, an inverting input terminal (−) connected to a connection node of the drain of the P-channel MOS transistor MP3 and the drain of the N-channel MOS transistor MN4, the differential amplifier circuit functioning as a voltage comparator circuit;

a P-channel MOS transistor MP5 which has a source connected to the high-voltage system power supply Vdd2 and a gate and a drain connected; and an N-channel MOS transistor MN6 which has a drain connected to the drain of the P-channel MOS transistor MP3, a gate connected to an output of the comparator circuit 204, and a source connected to the GND. A connection node of the drains of the P-channel MOS transistor MP5 and the drain of the N-channel MOS transistor MN6 is set to the output Vr5 of the bias generation circuit 203.

In this example, the DC bias replica circuit 202 is set to a replica of the level shift voltage generation circuit 201, and the low-voltage system inverter INV2 is set to have a same configuration as the low-voltage system inverter INV1 of the level shift voltage generation circuit 201. The P-channel MOS transistor MP3 of the DC bias replica circuit 202 is set to have a same structure as the P-channel MOS transistor MP1 of the level shift voltage generation circuit 201. The N-channel MOS transistor MN4 of the DC bias replica circuit 202 is set to have a same structure as the N-channel MOS transistor MN2 of the level shift voltage generation circuit 201. The resistor element R2 of the DC bias replica circuit 202 is set to have a same resistance value as the resistor element R1 of the level shift voltage generation circuit 201.

In the DC bias replica circuit 202, the low-voltage system inverter INV2 is connected to the gate of the N-channel MOS transistor MN4 by full feedback (with a feedback rate of 100%). An output voltage of the push-pull circuit formed of the P-channel MOS transistor MP3 and the N-channel MOS transistor MN4 (at the commonly connected drains of the P-channel MOS transistor MP3 and the N-channel MOS transistor MN4) is set to an output voltage Vr3 of the DC bias replica circuit 202.

In the DC bias replica circuit 202, the high-voltage system inverter INV4 that is driven by the high-voltage system power supply Vdd2 is set to have a same configuration as the high-voltage system inverter INV3 of the level shift voltage generation circuit 201 and is fully feedback connected. An output of the high-voltage system inverter INV4 is set to the output voltage Vr4 of the DC bias replica circuit 202. The output Vr5 of the bias generation circuit 203 is connected to the gate of the P-channel MOS transistor MP3 within the push-pull circuit through the resistor element R2.

The P-channel MOS transistor MP5 and the N-channel MOS transistor MN6 in the bias generation circuit 203 are respectively set to have same configurations as the P-channel MOS transistor MP1 and the N-channel MOS transistor MN2 in the level shift voltage generation circuit 201.

The output voltage Vr5 of the bias generation circuit 203 is connected to the resistor element R1 of the level shift voltage generation circuit 201 and the resistor element R2 of the DC bias replica circuit 202. The P-channel MOS transistor MP1 of the level shift voltage generation circuit 201, the P-channel MOS transistor MP3 of the DC bias replica circuit 202, and the P-channel MOS transistor MP5 of the bias generation circuit 203 form a current mirror (in which the P-channel MOS transistor MP5 constitutes an input-side transistor of the current mirror, P-channel MOS transistors MP1 and MP3 constitute output-side transistors of the current mirror). The N-channel MOS transistor MN6 of the bias generation circuit 203 receives a differential amplifier output (comparison result) of the differential amplifier circuit (comparator circuit) 204 at a gate thereof, changes a drain current (drain-to-source current) according to a gate voltage, and varies a voltage (output voltage Vr5) at a connecting point between the gate and the drain of the P-channel MOS transistor MP5. The output voltage Vr5 of the bias generation circuit 203 is supplied as a bias voltage to the gates of the P-channel MOS transistors MP1 and MP3 through the resistance elements R1 and R2.

In the level shift voltage generation circuit 201, the capacitance C1 is set to have sufficiently low impedance with respect to an input signal frequency, and the resistor element R1 is set to have sufficiently high impedance with respect to an input signal frequency of the capacitance C1.

The resistance value of the resistor element R2 of the DC bias replica circuit 202 is set to be equal to the resistance value of the resistor element R1 so that the resistor element R2 is a replica of the resistor element R1 of the level shift voltage generation circuit 201.

Figure 2:
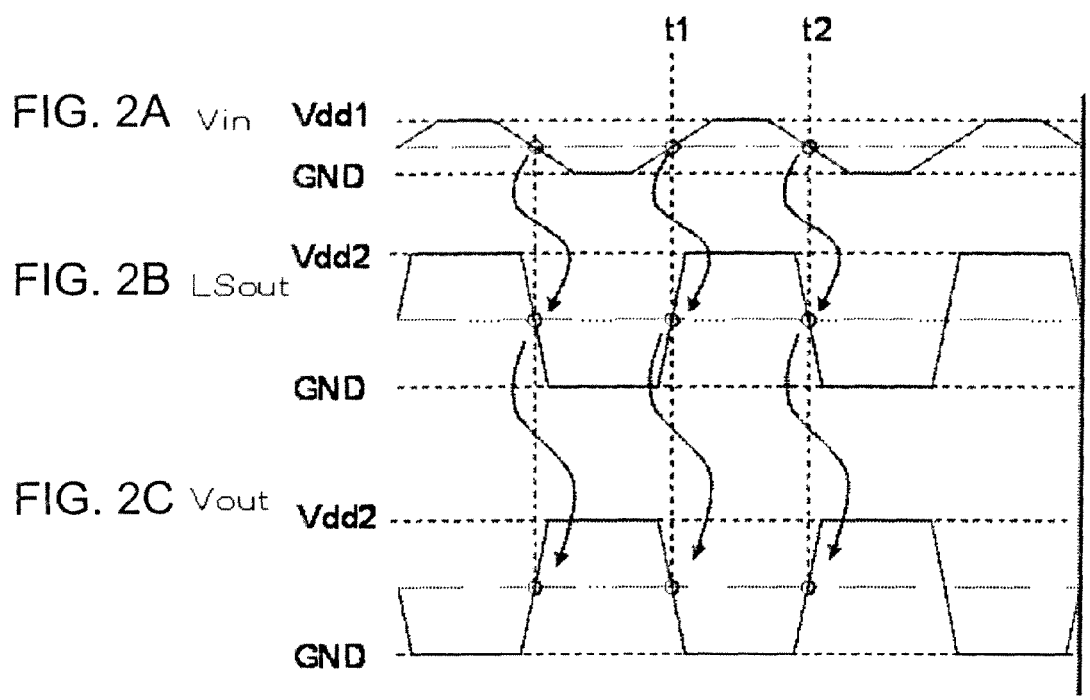
FIGS. 2A-2C are timing charts of the level shift circuit in the exemplary embodiment of the present invention.

FIGS. 2A-2C are timing charts showing an operation of the level shift circuit in this example illustrated in FIG. 1. The level shift circuit in this example will be described with reference to FIGS. 1 and 2.

In the DC bias replica circuit 202, the low-voltage system inverter INV2 and the high-voltage system inverter INV4 are fully feedback connected. Thus, the input voltage Vr2 and the output voltage Vr4 become respective logic threshold voltages of the inverters INV2 and INV4.

Further, in the DC bias replica circuit 202, the output voltage Vr4 becomes equal to the output voltage Vr3 at the connection node of the P-channel MOS transistor MP3 and the N-channel MOS transistor MN4, which form a replica of the push-pull circuit (MP1, MN2) of the level shift voltage generation circuit 201, due to the bias generation circuit 203, based on a condition of a virtual short (also referred to as virtual grounding or "imaginary short") of the differential amplifier circuit 204.

By configuring the level shift voltage generation circuit 201 and the DC bias replica circuit 202 by the same elements, logic thresholds of the low-voltage system inverter INV1 and the high-voltage system inverter INV3 in the level shift voltage generation circuit 201 respectively become equal to the input voltage Vr2 of the low-voltage system inverter INV2 and the output voltage Vr4 of the high-voltage system inverter INV4 in the DC bias replica circuit 202.

Further, a DC bias voltage for the PMOS transistor MP1 of the push pull circuit in the level shift voltage generation circuit 201 is supplied from the bias generation circuit 203, and the capacitance C1 is set to have a constant impedance that is sufficiently low with respect to the input signal frequency. With this arrangement, when an input signal voltage Vin crosses the input voltage Vr2 that is the logic threshold of the low-voltage system inverter INV1 at a time t1 (as shown in FIG. 2A), voltages of the level shift voltage generation circuit 201 all become equal to voltages of the DC bias replica circuit 202, in synchronization with the crossing. Then, the output LSout of the push-pull circuit of the level shift voltage generation circuit 201 becomes equal to the output voltage Vr3 or the output voltage Vr4 (as shown in FIG. 2B). An operation similar to this operation is performed when the input signal voltage Vin crosses the input voltage Vr2, which is the logic threshold of the low-voltage system inverter INV1 at a time t2.

That is, the output LSout of the push-pull circuit (MP1, MN2) for the input signal voltage Vin in the level shift voltage generation circuit 201 similarly operates both at the rise and fall of the input signal voltage Vin. As described above, the output LSout of the push-pull circuit (MP1, MN2) does not depend on an inclination of the rise/fall of the input signal voltage Vin. Even if the circuit that causes the output LSout to rise is different from the circuit that causes the LSout to fall, the output LSout operates similarly.

Accordingly, the duty ratio of the output LSout of the push-pull circuit at the logic threshold voltage of the high-voltage system inverter INV3 becomes equal to the duty ratio of the input signal voltage Vin at the logic threshold voltage of the low-voltage system inverter INV1 in the level shift voltage generation circuit 201. The high-voltage system inverter INV3 inverts and outputs the output LSout with the logic threshold of the high-voltage system which is equal to the output voltage Vr4 from high-voltage system inverter INV4. Thus, a level shift operation, where the duty ratio of the input signal voltage Vin is maintained at the output signal Vout, is achieved (as shown in FIG. 2C).

When the level shift circuit is operated, the inclination of the rise or fall of the input signal and the logic thresholds vary due to variation in temperature, power supply voltage or the like. However, the following relationship remains unchanged. That is, when the input signal voltage Vin crosses the input voltage Vr2 that is the logic threshold voltage of the low-voltage system inverter INV1 of the level shift voltage generation circuit 201, the output LSout of the push-pull circuit of the level shift voltage generation circuit 201 crosses the output voltage Vr4 that is the logic threshold of the high-voltage system inverter INV3. Thus, the level shift operation, where the duty ratio of the input signal voltage Vin is maintained at the output Vout, is achieved.

According to this example, the following effect can be obtained. That is, in synchronization with a time when the input signal voltage Vin crosses the logic threshold voltage of the low-voltage system inverter INV1, the output LSout of the push-pull circuit of the level shift voltage generation circuit 201 operates to cross the logic threshold of the output inverter INV3, irrespective of the inclination of the rise/fall of the input signal. The duty ratio of the output LSout of the push-pull circuit at the logic threshold voltage of the high-voltage system inverter INV3 and the duty ratio of the input signal voltage Vin at the logic threshold voltage of the low-voltage system inverter INV1 do not thereby vary and become equal.

Figure 3:
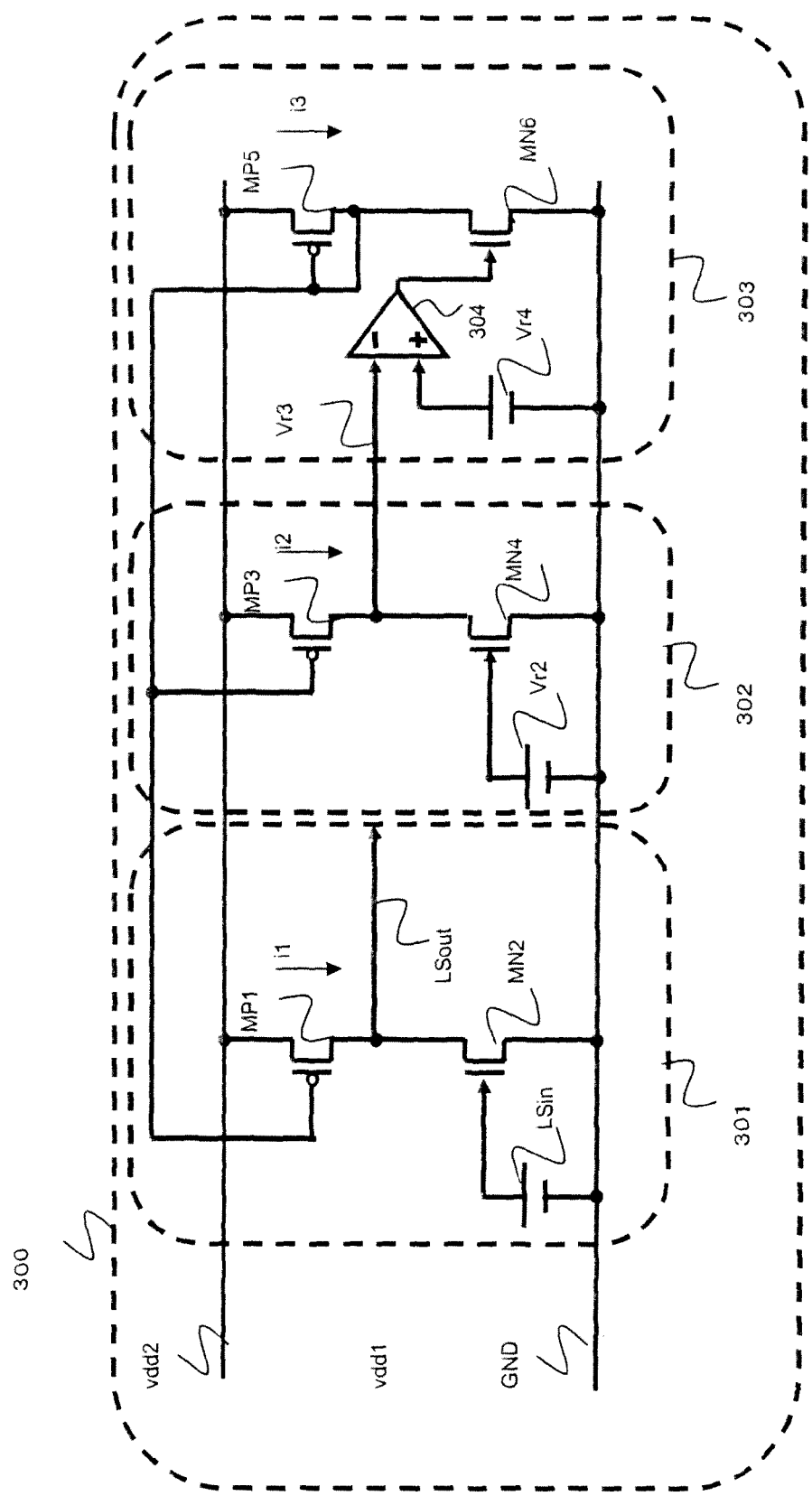
FIG. 3 is a diagram explaining a DC operation of the level shift circuit in the exemplary embodiment of the present invention.

FIG. 3 is a diagram for explaining the circuit in FIG. 1, based on a DC signal. That is, a level shift DC circuit 300 in FIG. 3, where an input and an output are replaced by DC signals, is provided for briefly describing an operation of the circuit in FIG. 1. As in the level shift circuit 200 shown in FIG. 1, the level shift DC circuit 300 includes a level shift DC voltage generation circuit 301, a DC bias replica DC circuit 302, and a bias generation DC circuit 303.

The level shift DC voltage generation circuit 301 includes a P-channel MOS transistor MP1 which has a source connected to a high-voltage system power supply Vdd2, a gate connected to an output of the bias generation circuit 303, and an N-channel MOS transistor MN2 which has a drain connected to a drain of the P-channel MOS transistor MP1, a gate connected to an input LSin (DC input), and a source connected to the GND.

The DC bias replica circuit 302 includes a P-channel MOS transistor MP3 which has a source connected to the power supply Vdd2, a gate connected to the output of the bias generation circuit 303, and an N-channel MOS transistor MN4 which has a drain connected to a drain of the P-channel MOS transistor MP3, a gate connected to an input voltage Vr2, and a source connected to the GND.

The bias generation circuit 303 includes a differential amplifier circuit (comparator circuit) 304 with a non-inverting input terminal (+) connected to a voltage Vr4 (DC input) and an inverting input terminal (−) connected to a connection node of the drains of the P-channel MOS transistor MP3 and the N-channel MOS transistor MN4 in the DC bias replica circuit 302, a P-channel MOS transistor MP5 which has a source connected to the power supply Vdd2 and a gate connected to a drain thereof, and an N-channel MOS transistor MN6 which has a drain connected to the drain of the P-channel MOS transistor MP3, a gate connected to an output of the differential amplifier circuit 304, and a source connected to the GND.

Referring to FIG. 3, the P-channel MOS transistors MP1, MP3, and MP5 are set to same elements, and the N-channel MOS transistors MN2, MN4, and MN6 are set to same elements.

An output LSout is set to an output voltage when an output LSin of a low-voltage system inverter INV1 is supplied to the N-channel MOS transistor MN2 in the level shift DC voltage generation circuit 301.

An output voltage Vr3 is set to an output voltage when the input voltage Vr2 is supplied to the N-channel MOS transistor MN4 of the DC bias replica DC circuit 302. The DC bias replica DC circuit 302 is a replica circuit of the level shift DC voltage generation circuit 301. Thus, when the output LSin is equal to the input voltage Vr2, the output LSout is equal to the output voltage Vr3 at any condition.

The bias generation DC circuit 303 is a feedback circuit by which the output voltage Vr3 of the DC bias replica DC circuit 302 is matched with the voltage Vr4. Current i3 that flows through the P-channel MOS transistor MP5, current i1 that flows through the P-channel MOS transistor MP1, and current i2 that flows through the P-channel MOS transistor MP3 are in a current mirror relationship. Thus, the following relation equation (1) holds:

$$i1 = i2 = i3 \qquad (1)$$

The input and output voltages are in a current mirror relationship. The DC bias replica DC circuit 302 is a replica circuit of the level shift DC voltage generation circuit 301, and the output LSout is equal to the output voltage Vr3. Thus, when the output LSin is equal to the input voltage Vr2, the relation given by the following equation (2) holds:

$$LSout = Vr4 \qquad (2)$$

In this example, the input voltage Vr2 is substituted for the low-voltage system logic threshold, while the output voltage Vr4 is substituted for the high-voltage system logic threshold.

In the level shift circuit 200, the low-voltage system logic threshold of the low-voltage system power supply Vdd1 in the level shift voltage generation circuit 201 is detected by the low-voltage system inverter INV2 as the input voltage Vr2. By configuring the low-voltage system inverter INV2 in the DC bias replica circuit 202 and the low-voltage system inverter INV1 in the level shift voltage generation circuit 201 using same elements, the low-voltage system logic threshold of the low-voltage system inverter INV1 in the level shift voltage generation circuit 201 matches the low-voltage system logic threshold of the low-voltage system inverter INV2 in the replica circuit 202 at any condition, even if transistor characteristic variations (variations in a threshold value Vth) due to fabrication variations occur. Synchronization is therefore achieved.

In the level shift circuit 200 of the present invention, the high-voltage system logic threshold of the high-voltage system power supply Vdd2 in the level shift voltage generation circuit 201 is detected by the high-voltage system inverter INV4 of the DC bias replica circuit 202 as the output voltage Vr4.

Next, assume a case where the threshold value Vth of the N-channel MOS transistors forming the high-voltage system inverter INV3 of the level shift voltage generation circuit 201 and the high-voltage system inverter INV4 of the DC bias replica circuit 202 decreases and the threshold value Vth of the P-channel MOS transistors is high, due to the fabrication variations. Description will be given about the case, using an input/output characteristic (rise of the input signal voltage Vin) in FIG. 4A and an input/output characteristic (fall of the input signal voltage Vin) in FIG. 4B.

Figure 4A:
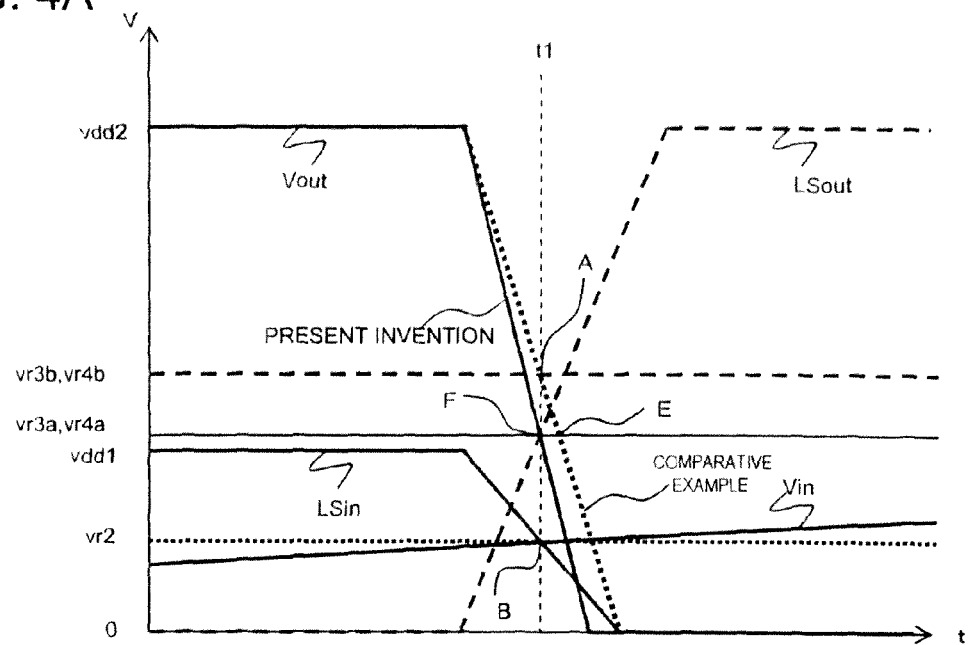
FIG. 4A is a graph showing input and output characteristics of the level shift circuit in the exemplary embodiment of the present invention.
Figure 4B:
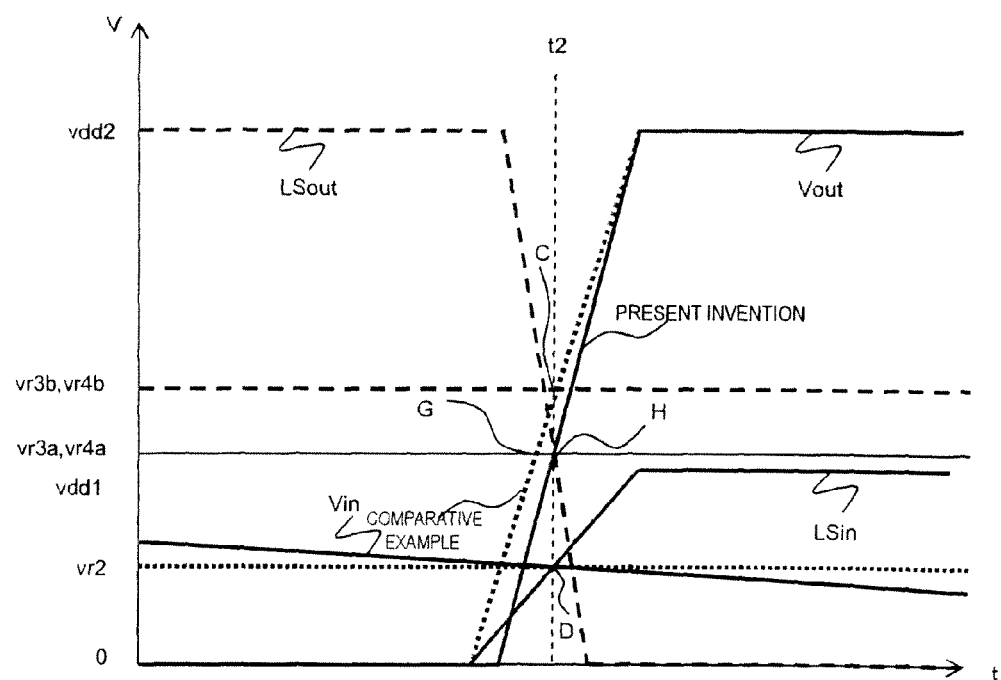
FIG. 4B is a graph showing input and output characteristics of the level shift circuit in the exemplary embodiment of the present invention.
Figure 5:
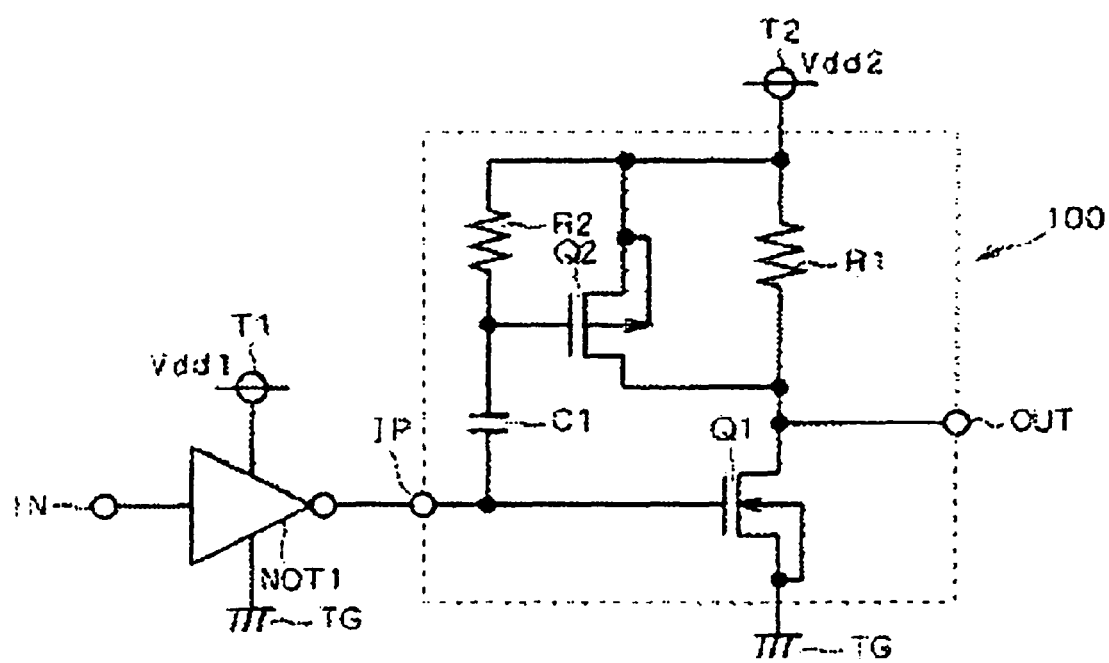
FIG. 5 is a diagram showing a circuit configuration of a level shifter in Patent Document 1.
Figure 7A:
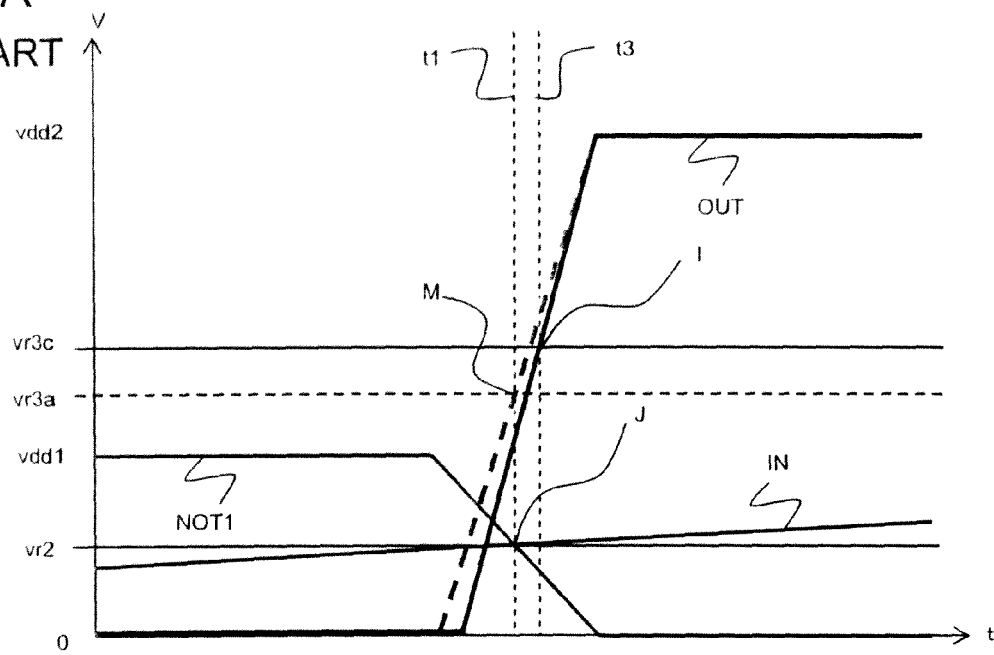
FIG. 7A is a graph explaining input and output characteristics of the level shifter in FIG. 5.
Figure 7B:
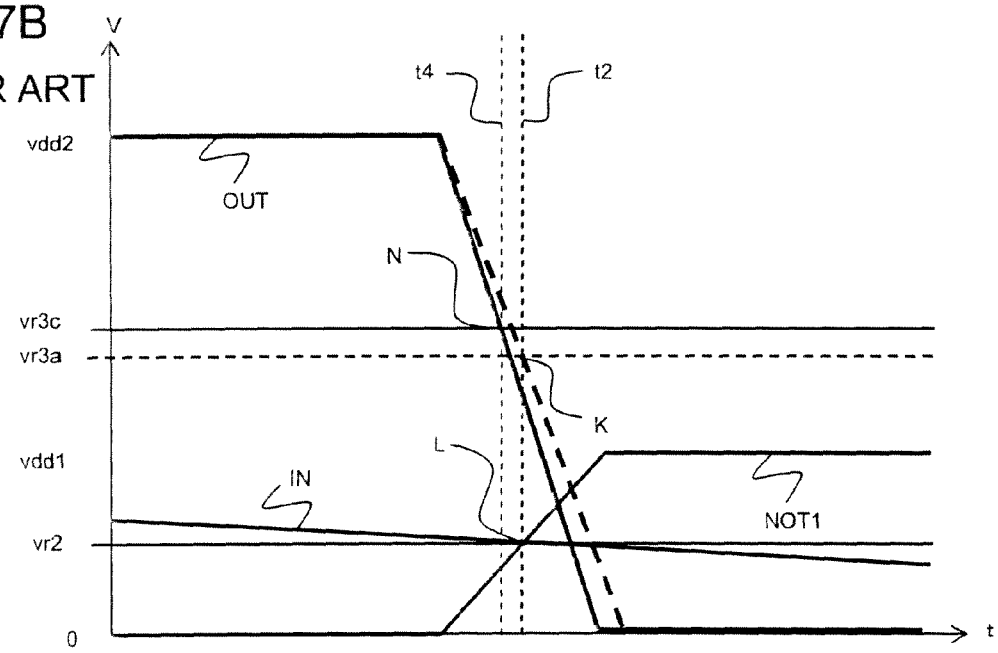
FIG. 7B is a graph explaining input and output characteristics of the level shifter in FIG. 5.

Referring to FIGS. 4A and 4B, a vertical axis indicates input and output voltages, while a horizontal axis indicates time. FIGS. 4A and 4B show a state where an output voltage Vr3*b* and an output voltage Vr4*b* respectively transition to an output voltage Vr3*a* and an output voltage Vr4*a* when the threshold value Vth of the N-channel MOS transistors decreases more than usual, and the threshold value Vth of the P-channel MOS transistors increases more than usual due to the fabrication variations (variations in the transistor threshold values Vth). Each of the output voltages Vr3*b* and Vr4*b* is the logic threshold of the high-voltage system when there are no fabrication variations (variations in the transistor threshold values Vth).

In a comparative example, an output Vout varies from an intersection A to an intersection E at a rise of an input signal voltage Vin, as shown in FIG. 4A (refer to the output Vout in the "comparative example" in FIG. 4A). Further, in the comparative example, the output Vout varies from an intersection H to an intersection G at a fall of the input signal voltage Vin, as shown in FIG. 4B (refer to the output Vout in the "comparative example" in FIG. 4B). For this reason, the duty ratios of the input and output signals become out of range. Thus, a level shift operation cannot be performed with the duty ratio of the input signal kept maintained.

Assume that in this example, the high-voltage system logic thresholds have respectively transitioned from Vr3*b* to Vr3*a* and from Vr4*b* to Vr4*a*. Even in this state, at a time t1 when the input signal voltage Vin crosses the input voltage Vr2 of the low-voltage system logic threshold at an intersection B, the output LSout crosses the output voltage Vr4*a* of the high-voltage system logic threshold at an intersection F (refer to the output Vout of the "present invention" in FIG. 4A).

At a time t2 when the input signal voltage Vin crosses the input voltage Vr2 of the low-voltage system logic threshold at an intersection D, the output LSout crosses the output voltage Vr4*a* of the high-voltage system logic threshold at an intersection H (refer to the output Vout of the "present invention" in FIG. 4B).

That is, in an input and output relationship where the output Vout varies from the intersection A to the intersection F at the rise of the input signal voltage Vin and the output Vout varies from the intersection C to the intersection H at the fall of the input signal voltage Vin, the intersection F and the intersection B are constantly controlled to be at the time t1, and the intersection H and D are constantly controlled to be at the time t2 so that synchronization is achieved. The intersections F and H occur when the fabrication variations have occurred.

In this example, the output Vout can be constantly kept synchronized with the input signal voltage Vin. It is because, by configuring the high-voltage system inverter INV4 of the DC bias replica circuit 202 and the high-voltage system inverter INV3 of the level shift voltage generation circuit 201 using the same elements, the level shift voltage generation circuit 201 is adjusted so that the high-voltage system logic threshold of the high-voltage system inverter INV3 in the level shift voltage generation circuit 201 matches the low-voltage system logic threshold of the high-voltage system inverter INV4 in the DC bias replica circuit 202 at any condition, even if fabrication variations (variations in the threshold values Vth of the transistors) occur. The level shift voltage generation circuit 201 is adjusted so that at a rise of the input signal Vin, the intersection A between the output Lsout and the output Vout, which would have been varied to the intersection E, is controlled to be the intersection F (for the output Vout of the "present invention" in FIG. 4A). The level shift voltage generation circuit 201 is further adjusted so that at a fall of the input signal Vin, the intersection C between the output Lsout and the output Vout, which would have been varied to the intersection G, is controlled to be the intersection H (for the output Vout of the "present invention" in FIG. 4B).

Even if the inclination of the rise/fall of the signal and the logic thresholds vary due to variations in temperature and high-voltage system power supply voltage in this example, the following input and output relationship constantly holds by performing a circuit operation similar to that described above. That is, when the input signal voltage Vin crosses the input voltage Vr2 of the low-voltage system logic threshold, the output LSout crosses the output voltage Vr4 of the high-voltage system logic threshold.

As described above, even if one of transistor characteristic variations (variations in the transistor threshold values Vth) due to the fabrication variations, variation in power supply voltage, and variation in temperature has occurred, the level shift circuit 200 in this example operates so that the output LSout of the push-pull circuit of the level shift voltage generation circuit 201 crosses the logic threshold of the output inverter INV3 in synchronization with crossing of the input signal voltage Vin through the logic threshold voltage of the low-power system inverter INV1, irrespective of the inclination of the rise/fall of the signal within the level shift circuit. The duty ratio of the output OUT for the input signal voltage Vin of the level shift voltage generation circuit 201 thereby becomes equal to the duty ratio of the input signal voltage Vin at the logic threshold voltage of the low-voltage system inverter INV1.

An operation and effect of the above-mentioned example will be summarized as follows.

(A) Even if transistor characteristic variations (variations in the transistor threshold values Vth) due to the fabrication variations occur at a time of receiving a high-frequency signal, a level shift operation can be performed with the duty ratio of the input signal maintained.

The reason for this is as follows. In the level shift circuit 200, the low-voltage system logic threshold of the low-voltage system power supply and the high-voltage system logic threshold of the high-voltage system power supply are detected, and the bias voltage for the gate voltage of the P-channel MOS transistor in the level shift voltage generation circuit 201 is controlled. With this arrangement, an output voltage level is made to track the high-voltage logic threshold of the high-voltage system power supply and is then output. A basic configuration of the level shift voltage generation circuit 201 is modified to the push-pull circuit formed of the P-channel MOS transistor and the N-channel MOS transistor, and the bias voltage is externally supplied to the P-channel MOS transistor of the push-pull circuit obtained by the modification. Then, the DC bias replica circuit 202 formed of the input inverter, push-pull circuit, and the output inverter like the level shift voltage generation circuit 201, and the bias generation circuit 203 are formed. The bias generation circuit 203 is formed of the differential amplifier circuit (comparator circuit) 204 for output voltages of the DC bias replica circuit 202 and a push-pull circuit, and supplies the DC bias to the P-channel MOS transistor of the level shift voltage generation circuit. With this arrangement, even if transistor characteristic variations (variations in the transistor thresholds Vth) due to fabrication variations occur, the level shift operation can be performed, with the duty ratio of the input signal maintained.

(B) Even if variation in power supply voltage occurs at a time of receiving a high-frequency signal, a level shift operation can be performed, with the duty ratio of the input signal maintained. The level shift operation can be performed for the same reason as in item (A).

(C) Even if variation in temperature occurs at a time of receiving a high-frequency signal, a level shift operation can be performed, with the duty ratio of the input signal maintained.

Each disclosure of Patent Document listed above is incorporated herein by reference. Modifications and adjustments of the exemplary embodiment and the example are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A level shift circuit comprising:
a level shift voltage generation circuit that receives an input signal having an amplitude between a voltage of a first voltage system power supply and a ground potential and performs a conversion of the amplitude of the input signal to produce an output signal voltage with an amplitude between a voltage of a second voltage system power supply and the ground potential, the voltage of the second voltage system power supply being higher than the voltage of the first voltage system power supply;
a replica circuit that comprises an element having a same configuration as an element of the level shift voltage generation circuit, the replica circuit monitoring a voltage corresponding a logic threshold of the first voltage system power supply, the replica circuit, with the logic threshold of the first voltage system power supply as an input, monitoring and outputting a voltage corresponding to a logic threshold of the second voltage system power supply; and
a bias generation circuit that receives an output from the replica circuit and generates a bias for adjusting a variation of the output signal voltage of the level shift voltage generation circuit and a variation of the output voltage of the replica circuit to supply the bias to the level shift voltage generation circuit and the replica circuit,
wherein the level shift voltage generation circuit generates the output signal voltage in such a manner that, at a time when a voltage of the input signal received by the level shift voltage generation circuit crosses the logic threshold of the first voltage system power supply the output signal voltage crosses the logic threshold of the second voltage system power supply, and
wherein the bias generation circuit comprises a comparator circuit that compares an output of the second voltage system of the replica circuit with the logic threshold voltage of the second voltage system outputted from the replica circuit.

2. The level shift circuit according to claim 1, wherein the replica circuit comprises:
a first logic circuit that has a signal amplitude between the voltage of the first voltage system power supply and the ground potential and has the same configuration as a corresponding circuit included in the level shift voltage generation circuit; and
a second logic circuit that has a signal amplitude between the voltage of the second voltage system power supply and the ground potential and has the same configuration as a corresponding circuit included in the level shift voltage generation circuit,
wherein the replica circuit has an arrangement in which the first logic circuit has an output fully feedback-connected to an input to detect the voltage corresponding to the logic threshold of the first voltage system and the second logic circuit has an output thereof fully feedback-connected to an input to detect the voltage corresponding to the logic threshold of the second voltage system.

3. A level shift circuit comprising:
a level shift voltage generation circuit that receives an input signal having an amplitude between a voltage of a first voltage system power supply and a ground potential and performs a conversion of the amplitude of the input signal to produce an output signal voltage with an amplitude between a voltage of a second voltage system power supply and the ground potential, the voltage of the second voltage system power supply being higher than the of the first voltage system power supply;

a replica circuit that comprises an element having a same configuration as an element of the level shift voltage generation circuit, the replica circuit monitoring a voltage corresponding to a logic threshold of the first voltage system power supply, the replica circuit, with the logic threshold of the first voltage system power supply as an input, monitoring and outputting a voltage corresponding to a logic the second voltage system power supply; and a bias generation circuit that receives an output from the replica circuit and generates a bias for adjusting a variation of the output signal voltage of the level shift voltage generation circuit and a variation of the output voltage of the replica circuit to supply the bias to the level shift voltage generation circuit and the replica circuit, wherein the level shift voltage generation circuit generates the output signal voltage in such a manner that, at a time when a voltage of the input signal received by the level shift voltage generation circuit crosses the logic threshold of the first voltage system power supply the output signal voltage crosses the logic threshold of the second voltage system power supply, wherein the level shift voltage generation circuit comprises:

a first logic circuit that is connected between the first voltage system power supply and the ground potential and that receives the input signal;

a first resistance element and a capacitance element connected in series between an output of the bias generation circuit and an output of the first logic circuit;

a first push-pull circuit including first and second transistors connected between the second voltage system power supply and the ground potential, the first transistor having a control terminal connected to a connection node of the first resistance element and the capacitance element, the second transistor having a control terminal connected to the output of the first logic circuit; and a second logic circuit that is connected between the second voltage system power supply and the ground potential, receives an output of the first push-pull circuit, and outputs an output signal having an amplitude between the voltage of the second voltage system power supply and the ground potential.

4. The level shift circuit according to claim 1, wherein the replica circuit comprises a push-pull circuit including first and second transistors connected between the second voltage system power supply and the ground potential, and wherein the bias generation circuit comprises a transistor connected between the second voltage system power supply and the output of the bias generation circuit, the transistor of the bias generation circuit forming a current mirror with the first transistor of the push-pull circuit in the replica circuit, the first transistor being connected on the second voltage system power supply side.

5. The level shift circuit according to claim 3, wherein the bias generation circuit comprises a comparator circuit that compares an output of the second voltage system of the replica circuit with the logic threshold voltage of the second voltage system outputted from the replica circuit, and wherein the bias generation circuit generates a bias voltage that adjusts the output voltage of the level shift voltage generation circuit and the output voltage of the replica circuit, based on a result of the comparison by the comparator circuit.

6. The level shift circuit according to claim 3, wherein the replica circuit comprises:

a third logic circuit connected between the first voltage system power supply and the ground potential, an output of the third logic circuit being fully fed back to an input of the third logic circuit, the output of the third logic circuit providing the logic threshold of the first voltage system;

a second push-pull circuit including third and fourth transistors connected between the second voltage system power supply and the ground potential, the third transistor comprising a control terminal connected to the output of the bias generation circuit through a second resistance element, the second transistor comprising a control terminal connected to the output of the third logic circuit; and a fourth logic circuit connected between the second voltage system power supply and the ground potential, an output of the fourth logic circuit being fully fed back to an input of the fourth logic circuit, wherein the output of the fourth logic circuit provides the logic threshold of the second voltage system, wherein the third logic circuit includes one or more elements having the same configuration as one or elements of the first logic circuit of the level shift voltage generation circuit, wherein the fourth logic circuit includes one or more elements having the same configuration as the second logic circuit of the level shift voltage generation circuit, wherein the third and fourth transistors respectively have the same configuration as the first and second transistors of the level shift voltage generation circuit, and wherein the second resistance element has the same resistance value as the first resistance element of the level shift voltage generation circuit.

7. The level shift circuit according to claim 3, wherein the bias generation circuit comprises:

a comparator circuit that compares an output voltage of the fourth logic circuit with an output voltage of the second push-pull circuit;

a diode-connected fifth transistor connected between the second voltage system power supply and the output of the bias generation circuit; and a sixth transistor that is connected between the output of the bias generation circuit and the ground potential and receives an output voltage of the comparator circuit at a control terminal thereof, wherein the first and second transistors of the level shift voltage generation circuit respectively have the same configuration as the fifth and sixth transistors.

8. The level shift circuit according to claim 7, wherein the first, third, and fifth transistors form a current mirror.

9. The level shift circuit according to claim 6, wherein each of the first, second, third, and fourth logic circuits each include an inverter circuit.

10. The level shift circuit according to claim 3, wherein the bias replica circuit further comprises:

a first inverter connected between the first voltage system power supply and the ground potential; and a second inverter connected between the second voltage system power supply and the ground potential.

11. The level shift circuit according to claim 10, wherein the first inverter comprises a first inverter output that is feedback connected to a first inverter input of the first inverter, and wherein the second inverter comprises a second inverter output that is feedback connected to a second inverter input of the second inverter.

12. The level shift circuit according to claim 3, wherein the bias generation circuit comprises a comparator circuit comprising:
- a non-inverting input terminal connected to an inverter output of an inverter located in the replica circuit; and
- an inverting input terminal connected to a first drain of a first transistor and a second drain of a second transistor.

13. The level shift circuit according to claim 1, wherein the level shift voltage generation circuit comprises a first logic circuit that is connected between the first voltage system power supply and the ground potential and that receives the input signal.

14. A level shift circuit comprising:
- a level shift voltage generation circuit that receives an input signal having an amplitude between a voltage of a first voltage system power supply and a ground potential and performs a conversion of the amplitude of the input signal to produce an output signal voltage with an amplitude between a voltage of a second voltage system power supply and the ground potential, the voltage of the second voltage system power supply being higher than the voltage of the first voltage system power supply;
- a replica circuit that comprises an element having a same configuration as an element of the level shift voltage generation circuit, the replica circuit monitoring a voltage corresponding to a logic threshold of the first voltage system power supply, the replica circuit, with the logic threshold of the first voltage system power supply as an input, monitoring and outputting a voltage corresponding of the second voltage system power supply; and
- a bias generation circuit that receives an output from the replica circuit and generates a bias for adjusting a variation of the output signal voltage of the level shift voltage generation circuit and a variation of the output voltage of the replica circuit to supply the bias to the level shift voltage generation circuit and the replica circuit,
- wherein the level shift voltage generation circuit comprises:
  - a first logic circuit connected between a first voltage system power supply and a ground potential, the first logic circuit receiving an input signal;
  - a first resistance element and a capacitance element connected in series between an output of the bias generation circuit and an output of the first logic circuit;
  - a first push-pull circuit including first and second transistors connected between a second voltage system power supply and the ground potential, the first transistor having a control terminal connected to a connection node of the first resistance element and the capacitance element, the second transistor having a control terminal connected to the output of the first logic circuit; and
  - a second logic circuit connected between the second voltage system power supply and the ground potential, the second logic circuit receiving an output of the first push-pull circuit and outputting an output signal having an amplitude between a voltage of the second voltage system power supply and the ground potential.

15. The level shift circuit according to claim 14, wherein the first and second logic circuits include an inverter circuit.

16. The level shift circuit according to claim 1, wherein the replica circuit comprises a push-pull circuit including first and second transistors connected between the second voltage system power supply and the ground potential.

17. The level shift circuit according to claim 13, wherein the level shift voltage generation circuit further comprises a second logic circuit that is connected between the second voltage system power supply and the ground potential.

18. A level shift circuit comprising:
- a level shift voltage generation circuit that receives an input signal having an amplitude between a voltage of a first voltage system power supply and a ground potential and performs a conversion of the amplitude of the input signal to produce an output signal voltage with an amplitude between a voltage of a second voltage system power supply and the ground potential, the voltage of the second voltage system power supply being than the voltage of the first voltage system power supply;
- a replica circuit that comprises an element having a same configuration as an element of the level shift voltage generation circuit, the replica circuit monitoring a voltage corresponding to a logic threshold of supply, the replica circuit, with the logic threshold of the first voltage system power supply as an input, monitoring and outputting a voltage corresponding to a logic threshold of the second voltage system power supply; and
- a bias generation circuit that receives an output from the replica circuit and generates a bias for adjusting a variation of the output signal voltage of the level shift voltage generation circuit and a variation of the output voltage of the replica circuit to supply the bias to the level shift voltage generation circuit and the replica circuit,
- wherein the replica circuit comprises:
  - a first logic circuit that has a signal amplitude between the voltage of the first voltage system power supply and the ground potential and has the same configuration as a corresponding circuit included in the level shift voltage generation circuit; and
  - a second logic circuit that has a signal amplitude between the voltage of the second voltage system power supply and the ground potential and has the same configuration as a corresponding circuit included in the level shift voltage generation circuit,
- wherein the replica circuit has an arrangement in which the first logic circuit has an output fully feedback-connected to an input to detect the voltage corresponding to the logic threshold of the first voltage system and the second logic circuit has an output thereof fully feedback-connected to an input the voltage corresponding to the logic threshold of the second voltage system,
- wherein the level shift voltage generation circuit generates the output signal voltage in such a manner that, at a time when a voltage of the input signal received by the level shift voltage generation circuit crosses the logic threshold of the first voltage system power supply the output signal voltage crosses the logic threshold of the second voltage system power supply, and
- wherein the output of the first logic circuit is directly connected to the input of the first logic circuit.

* * * * *